United States Patent
Yu

(10) Patent No.: US 6,455,903 B1
(45) Date of Patent: Sep. 24, 2002

(54) DUAL THRESHOLD VOLTAGE MOSFET BY LOCAL CONFINEMENT OF CHANNEL DEPLETION LAYER USING INERT ION IMPLANTATION

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/491,267

(22) Filed: Jan. 26, 2000

(51) Int. Cl.[7] ............................................... H01L 29/76
(52) U.S. Cl. ...................... 257/391; 257/392; 257/402; 438/289; 438/290
(58) Field of Search ................................. 257/402, 376, 257/611, 612, 391, 392; 438/289, 290

(56) References Cited

U.S. PATENT DOCUMENTS

| | | | |
|---|---|---|---|
| 3,869,786 A | 3/1975 | Adam et al. .................. 29/571 |
| 3,969,744 A | * 7/1976 | Nicholas et al. ............. 257/392 |
| 4,053,925 A | * 10/1977 | Burr et al. .................... 257/376 |
| 4,080,718 A | * 3/1978 | Richman ....................... 257/391 |
| 4,092,660 A | 5/1978 | Blocker, III .................. 357/22 |
| 4,268,950 A | * 5/1981 | Chatterjee et al. ........... 257/391 |
| 4,358,326 A | 11/1982 | Doo .............................. 148/174 |
| 4,472,871 A | * 9/1984 | Green et al. .................. 257/392 |
| 4,507,158 A | 3/1985 | Kamins et al. |
| 4,523,213 A | 6/1985 | Konaka et al. |
| 4,779,127 A | 10/1988 | Honjo .......................... 357/41 |
| 4,885,618 A | 12/1989 | Schubert et al. |
| 5,072,267 A | 12/1991 | Hattori ........................ 357/23.4 |
| 5,100,830 A | 3/1992 | Morita ......................... 437/64 |
| 5,166,768 A | 11/1992 | Ito ............................... 257/523 |
| 5,223,724 A | 6/1993 | Green, Jr. .................... 257/194 |
| 5,252,843 A | 10/1993 | Suzuki ......................... 257/284 |
| 5,329,138 A | 7/1994 | Mitani et al. ................ 257/42 |
| 5,448,094 A | 9/1995 | Hsu ............................. 257/330 |
| 5,463,241 A | 10/1995 | Kubo | |

(List continued on next page.)

FOREIGN PATENT DOCUMENTS

| | | | | |
|---|---|---|---|---|
| JP | 360132343 A | 7/1985 | .......... H01L/21/76 |
| JP | 363304661 A | 12/1988 | .......... H01L/27/08 |
| JP | 403096278 A | 4/1991 | |
| JP | 407078994 A | 3/1995 | |

OTHER PUBLICATIONS

"Smart–Cut: The Basic Fabrication Process for Unibond SOI Wafers", Auberton–Herve Mar. 3, 1997.

*Primary Examiner*—Mark V. Prenty
(74) *Attorney, Agent, or Firm*—Foley & Lardner

(57) ABSTRACT

An integrated circuit and method of fabricating integrated circuits is provided for an integrated circuit having threshold voltage adjustment. Unlike conventional methods and devices, threshold voltage adjustment is provided by an inert ion implantation process whereby inert ions are implanted into an underlying substrate. The implantation forms a semi-insulative layer comprised of an accumulation of inert ions. The inert ion region is formed between source and drain regions of a device on the integrated circuit. During operation of the device, the accumulation region confines the depth of the depletion layer. By confining the depth of the depletion layer, the threshold voltage of the device is reduced.

20 Claims, 3 Drawing Sheets

U.S. PATENT DOCUMENTS

| | | | |
|---|---|---|---|
| 5,514,896 A | * 5/1996 | Tsunoda | 257/391 |
| 5,554,546 A | 9/1996 | Malhi | |
| 5,614,428 A | 3/1997 | Kapoor | 437/41 |
| 5,652,162 A | 7/1997 | Liao | 437/45 |
| 5,654,570 A | 8/1997 | Agnello | 257/338 |
| 5,663,092 A | 9/1997 | Lee | 438/253 |
| 5,677,224 A | 10/1997 | Kadosh et al. | 437/57 |
| 5,726,084 A | 3/1998 | Boyd et al. | 438/239 |
| 5,760,451 A | 6/1998 | Yu | 257/382 |
| 5,773,336 A | 6/1998 | Gu | 438/199 |
| 5,773,871 A | 6/1998 | Boyd et al. | 257/532 |
| 5,780,899 A | 7/1998 | Hu et al. | 257/335 |
| 5,854,503 A | 12/1998 | Hsueh et al. | 257/347 |
| 5,895,253 A | 4/1999 | Akram | 438/424 |
| 5,914,523 A | 6/1999 | Bashir et al. | 257/520 |
| 5,952,701 A | 9/1999 | Bulucea et al. | 257/407 |
| 6,097,076 A | 8/2000 | Gonzalez et al. | 438/287 |
| 6,107,128 A | 8/2000 | Ishii et al. | 438/225 |
| 6,180,443 B1 | * 1/2001 | Kang et al. | 438/289 |
| 6,190,952 B1 | 2/2001 | Xiang et al. | 438/155 |
| 6,281,555 B1 | 8/2001 | Yu et al. | 257/374 |
| 6,281,559 B1 | 8/2001 | Yu et al. | 257/407 |

* cited by examiner

DUAL THRESHOLD VOLTAGE MOSFET BY LOCAL CONFINEMENT OF CHANNEL DEPLETION LAYER USING INERT ION IMPLANTATION

CROSS-REFERENCE TO RELATED APPLICATIONS

The present application is related to U.S. Pat. No. 6,084,271 which issued on Jul. 4, 2000 by Yu et al., and U.S. application Ser. No. 09/187498 entitled, "Method of Manufacturing a Transistor with a Local Insulator Structure", filed Nov. 6, 1998 by Yu et al., both assigned to the assignee of the present application.

FIELD OF THE INVENTION

The present invention relates generally to a method of fabricating an integrated circuit (IC) and more specifically to a method of fabricating an IC having dual threshold voltage capability.

BACKGROUND OF THE INVENTION

In very large-scale integrated circuits (VLSI), and even more so in ultra large-scale integrated (ULSI) circuits, it is desirable to design and fabricate MOSFET devices with different threshold voltages on the same integrated circuit (IC). By allowing MOSFET devices with differing threshold voltages, IC performance can be improved without unnecessarily increasing power dissipation. For example, in a speed critical signal path, MOSFET devices with low threshold voltages can be used. A MOSFET with a low threshold voltage has an increased drive current and thus, an increased transistor switching speed. Alternatively, in a non-critical signal path where circuit speed is less important, MOSFET devices with high threshold voltages can be used. A MOSFET with a high threshold voltage exhibits reduced leakage current and thus, reduced standby power dissipation.

The ability to decrease power dissipation while increasing IC performance is critical in many applications involving ICs. In some applications, it is common for IC devices to be continually powered. For example, in a personal computer (PC) it is desirable to leave the machine operational to avoid time wasted booting the machine. In a PC, it is desirable to have very low power dissipation when the machine is powered, but not in use. But, when he machine is in use, increased circuit performance is desirable.

A notebook computer provides another application of ICs including dual threshold voltage MOSFET devices. In the optimal notebook computer, it is desirable to achieve a high circuit performance and yet maintain extended battery life. By using ICs with dual threshold voltages, the IC performance can be increased while avoiding unnecessary increase in power dissipation and a corresponding degradation in battery life.

In the conventional CMOS process, dual threshold voltages are realized by implanting transistor active areas with differing levels of dopant density (e.g. different dopant dose). For example, for transistor active areas where a low threshold voltage is desired, a regular dopant density is implanted into the channel region (a regular channel implant). In other active areas, where a high threshold voltage is required, an additional implant is performed to increase dopant density in the channel area (an additional channel implant).

While the conventional method provides transistors with dual threshold voltages, the method has a negative impact on IC yield and manufacturability. Most notably, as short-channel effects are determined by the channel implant dopant concentration, the conventional method can adversely impacts short-channel effects within the IC. By having different levels of dopant concentration in different active areas, short-channel effects vary from one active area to another across the wafer. This variance in short-channel performance makes IC fabrication more difficult and less predictable.

Accordingly, there is a need for an improved method of fabricating dual threshold voltage IC devices. Further, there is a need for a method which allows for multiple threshold voltage IC devices that does not result in varying short-channel effects across the IC. Further still, there is a need for a method of fabricating an integrated circuit having dual threshold voltage IC devices without utilizing conventional channel implants.

SUMMARY OF THE INVENTION

According to one embodiment, a method provides voltage adjustment between two regions of a device. The device includes a channel region between the two regions. The method includes providing a semiconductor substrate and providing an inert material into the semiconductor substrate. The inert material accumulates below the channel region and confines a depletion layer dimension during operation of the device.

According to another embodiment, a method of fabricating an integrated circuit is provided. The integrated circuit includes voltage threshold adjustment between two regions of a device. In this embodiment, the device includes a channel region between the two regions. The method includes providing a semiconductor substrate, forming a gate on the substrate near the channel region, and implanting an inert implant material through the gate so that the inert implant material accumulates beneath the channel region within the substrate. Advantageously, the accumulation of implant material confines a depletion layer dimension during operation of the device.

According to another embodiment, an integrated circuit device having voltage threshold adjustment is provided between two regions of the device. The device includes a channel region between the two regions. Further, the device comprises a semiconductor substrate and an accumulation of inert material below the channel region. Advantageously, the accumulation of inert material confines a depletion layer dimension during operation of the device.

According to yet another embodiment, a transistor having a gate, channel region, source and drain is disclosed. The gate is disposed over the channel region which is formed between the source and drain. The transistor includes an accumulation of inert ions formed below the channel region. Advantageously, the accumulation of inert ions provides a semi-insulative layer below the channel region, which acts to prevent the channel from extending deeper in a vertical direction during operation of the transistor.

BRIEF DESCRIPTION OF THE DRAWINGS

The present invention will be described with reference to the accompanying drawings, wherein like numerals denote like elements, and.

DETAILED DESCRIPTION OF THE PREFERRED EMBODIMENTS

Figure 1:
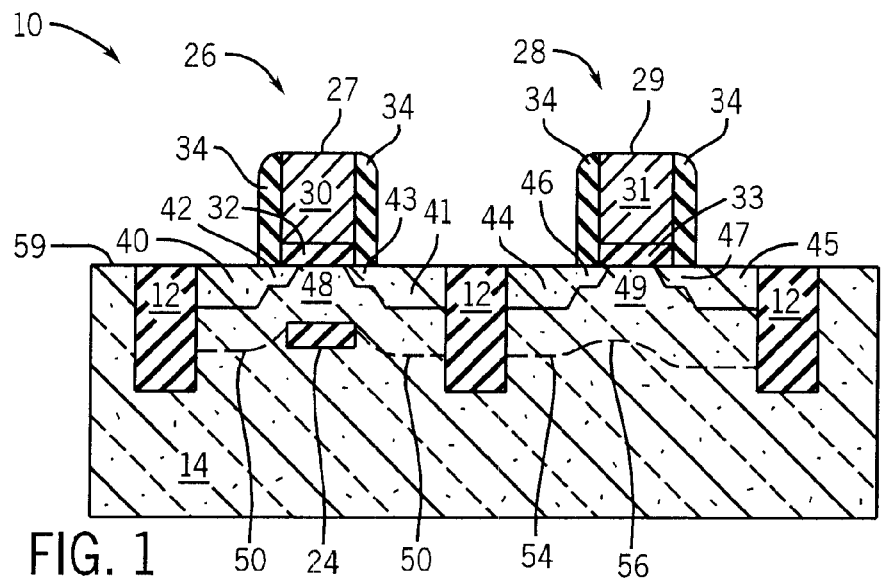
FIG. 1 is a cross-sectional view of a portion of a semiconductor substrate having voltage threshold adjustment in accordance with an exemplary embodiment of the present invention.

Referring first to FIG. 1, FIG. 1 is a cross-sectional view of a portion 10 of a semiconductor substrate 14 having voltage threshold adjustment in accordance with an exemplary embodiment of the present invention. Substrate 14 preferably comprises silicon, and may also comprise gallium arsenide or other semi-conductive materials.

Portion 10 includes a device 26 and a device 28 fabricated thereon. Device 26 may be a transistor, such as a metal oxide semiconductor field effect transistor (MOSFET) or other device requiring threshold voltage adjustment. Device 26 may be fabricated according to any of a number of known fabrication techniques, such as a complementary metal oxide semiconductor (CMOS) process. Device 28 may be a transistor, such as a metal oxide semiconductor field effect transistor (MOSFET) or other device not requiring threshold voltage adjustment. Similar to device 26 device 28 may be fabricated according to any of a number of known fabrication techniques, such as a complementary metal oxide semiconductor (CMOS) process.

In this presently preferred embodiment, devices 26 and 28 are MOSFET devices including source regions 40 and 44, drain regions 41 and 45, source extensions 42 and 46, and drain extensions 43 and 47 of substrate 14. Regions 40, 41, 42, 43, 44, 45, 46 and 47 may be doped with a dopant material, e.g. boron, phosphorus, indium, arsenic, boron difluoride or other dopant to form P-type or N-type doped regions.

Device 26 includes a gate stack 27 having a conductive portion 30 made from a conductive material such as polysilicon. Gate stack 27 further includes an insulative portion 32 which, in this embodiment, may be an oxide layer or layer of other insulative material. Gate stack 27 also may include sidewall spacers 34 to isolate conductive portion 30 from neighboring fabrication layers of portion 10.

Device 28 includes a gate stack 29 having a conductive portion 31 made from a conductive material such as polysilicon. Gate stack 29 further includes an insulative portion 33 which, in this embodiment, may be an oxide layer or layer of other insulative material. Gate stack 29 also may include sidewall spacers 34 to isolate conductive portion 31 from neighboring fabrication layers of portion 10.

Device 26 and device 28 further include channel regions 48 and 49 respectively. Channel regions 48 and 49 exist between the source and drain areas. Specifically, channel region 48 is a region between source 40 and drain 41 regions. Similarly, channel region 49 is a region between source 44 and drain 45 regions. Channel regions 48 and 49 may also be doped to improve the conductivity of the region by allowing carriers to pass freely between source regions and drain regions when devices 26 and 28 are respectively in the ON state. Portion 10 may also include shallow trench isolation structures 12 which provide electrical isolation between devices 26, 28 and other neighboring devices (not shown).

Portion 10 further includes region 24 of semiconductor substrate 14 located near channel region 48 and advantageously between source region 40 and drain region 41. Zion 24 can be located below channel region 48 and partially below a source extension 42 and a drain extension 43. Region 24 is comprised of an implant material implanted in substrate 14. The implant material may be any material that is not electrically activated by a subsequent thermal annealing process step, e.g. inert ions such as nitrogen ($N^+$), oxygen ($O^+$), xenon ($Xe^-$) and argon ($Ar^+$). Region 24 preferably contains an accumulation of inert ion, such as, nitrogen ($N^+$). Region 24 forms a semi-insulating layer in an area below top surface 59 of substrate 14. During operation of device 26, region 24 advantageously prevents the channel depletion layer from extending deeper in the vertical direction. Thus, channel depletion layer thickness is confined by inert ion implantation region 24.

Advantageously, confining the depth of the channel depletion layer results in a reduced threshold voltage for device 26. Specifically, threshold voltage is determined by the amount of charge in the channel depletion layer which is a function of channel depletion layer depth. Thus, the depth of implantation region 24 controls the threshold voltage of device 26. For illustration, device 28 is shown without an implantation layer. Because channel depletion layer depth of device 28 is not confined by an implantation region, the threshold voltage of device 28 is higher than the threshold voltage of device 26 which includes implantation region 24.

As a further illustration, dashed line 50 and dashed line 54 represent the depth of the channel depletion layer during operation of devices 26 and 28, respectively. As previously explained, in device 26, the depth of the channel depletion layer extends from top surface 59 of substrate 14 to the top surface of implantation region 24 (coincident with dashed line 50). Unlike device 26, the channel depletion layer of device 28 is not confined by an implantation layer, but rather extends without restriction from top surface 59 of substrate 14 to dashed line 54 at point 56.

It should be recognized and understood that, by forming different implantation layers at different depths, many different devices with different threshold voltages can be built on the same IC. For each different threshold voltage desired, a separate inert ion implantation is performed at a different dose and energy. Generally, a separate photolithography mask would be associated with each different voltage threshold desired.

Figure 2:
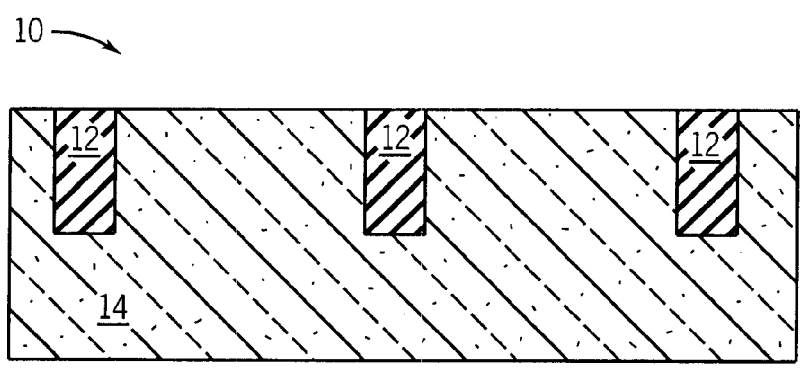
FIG. 2 is a cross-sectional view of the portion of the semiconductor substrate illustrated in FIG. 1, showing an initial semiconductor substrate.

Referring now to FIGS. 2 through 8, a method of manufacturing portion 10 of substrate 14 according to the exemplary embodiment is described. Referring first to FIG. 2, isolation structures 12 formed in substrate 14 according to shallow trench isolation (STI) methods well known in the art. Typically, isolation structures 12 contain an insulative material for providing electrical isolation between devices 26, 28 (FIG. 1) and neighboring devices (not shown) and can be manufactured according to any technique.

Figure 3:
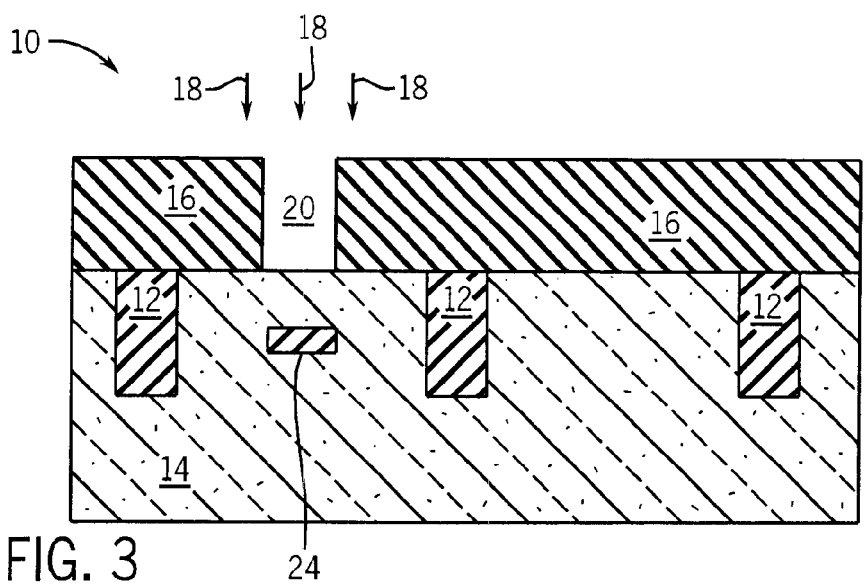
FIG. 3 is a cross-sectional view of the portion illustrated in FIG. 1, showing an inert ion implant step.

Referring now to FIG. 3, a photoresist layer 16 is disposed over portion 10. Photolithography is performed to open an aperture 20 in the photoresist. Specifically, aperture 20 is opened over a selected active channel area in substrate 14 where voltage threshold modification is desired. After aperture 20 is opened, the material implantation step can be performed. Alternatively, photoresist layer 16 can be provided over a hard mask layer, an insulative layer or both. Photoresist layer 16 can be used to define an opening in the hard mask layer and insulative layer.

As indicated by arrows 18, an implant material is implanted through aperture 20 and into substrate 14. The implant material may be any material which will not become electrically activated during a subsequent thermal annealing step due to the material having a large activation energy. In the presently preferred embodiment, the implant material may include, but is not limited to, inert ions, such as nitrogen ($N^+$), oxygen ($O^+$), xenon ($Xe^+$) and argon ($Ar^+$) ions. Thus, inert ion implantation is performed selectively in the active channel region of transistors designed to have reduced threshold voltages.

The implant material is implanted using a conventional implantation device, e.g. the Varian E220 device manufactured by Varian Corp. of Palo Alto, Calif., with a high dosage, i.e. between $1\times10^{16}$ dopants per $cm^2$ and $1\times10^{17}$ dopants per $cm^2$. Briefly, energetic, charged atoms or molecules are directly introduced into substrate 14 by an acceleration apparatus, such as, the Varian E220 device mentioned above, which accelerates the ions to between 10 and 100 kiloelectronVolts (keV). This implanted material forms region 24 of substrate 14 comprising a concentration of $10^{19}$ to $10^{20}$ (e.g. nitrogen (N+)) ions per centimeter cubed. Specifically, energy used to implant ions 18 and dose of ions 18 is controlled so that implant region 24 forms at a desired depth below top surface 59 (see FIG. 1) of substrate 14. In a preferred embodiment, the desired depth is 20–50 nm below top surface 59. Region 24 preferably extends from 30 to 40 nm below top surface 59.

Figure 4:
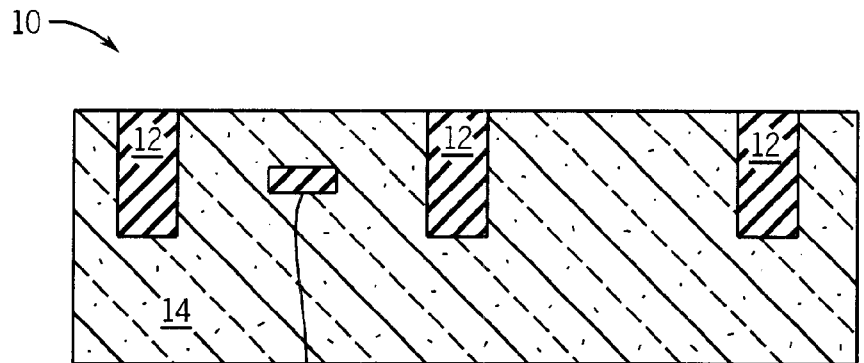
FIG. 4 is a cross-sectional view of a portion illustrated in FIG. 1 showing a photoresist removal step.

Region 24 forms a semi-insulating layer in the subsurface region, which keeps the depletion layer around channel 48 (see FIG. 1) from extending vertically into substrate 14. After ion implantation is complete and region 24 is formed, photoresist 16 is removed as illustrated in FIG. 4.

After formation of implant region 24 in substrate 14, fabrication of portion 10 follows any conventional IC manufacturing steps known in the art such as conventional complementary metal oxide semiconductor (CMOS) processes. Conventional CMOS processing is used to form the gate, source/drain regions, contacts, and interconnects. The body thickness of transistors built in the area where the inert ion implant is received have a thinner channel depletion layer because of the sub-surface insulative layer. These transistors have lower threshold voltage than transistors constructed in an area where no additional inert ion implant is performed.

Figure 5:
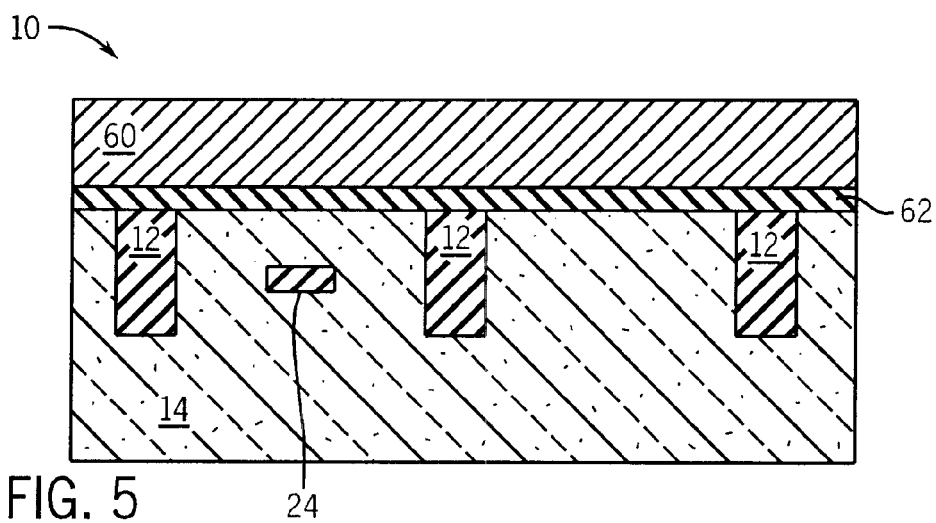
FIG. 5 is a cross-sectional view of the portion illustrated in FIG. 4 showing a polysilicon and thin insulative layer deposition step.

FIGS. 5 through 8 illustrate succeeding conventional CMOS manufacturing steps. Referring to FIG. 5, typically, substrate 14 is lightly doped to form well regions in substrate 14 between isolation structures 12. Dopants used in forming well regions are opposite in type (P-type or N-type) from substrate 14. In addition, an insulative layer 62 is thermally grown over substrate 14 or applied over substrate 14 using a known deposition process, such as, chemical vapor deposition (CVD) or physical vapor deposition (PVD). Preferably, layer 62 is a layer of silicon dioxide ($SiO_2$) between 20–50 Å thick. After forming insulative layer 62, layer 60 can be formed over insulative layer 62. Layer 60 can be a semiconductor layer or film, such as, a polysilicon layer, or a polysilicon/germanium layer. Layer 62 is approximately 1000–2000 Å thick. In addition, layer 62 is preferably undoped polysilicon formed by low pressure chemical vapor deposition (CVD).

Figure 6:
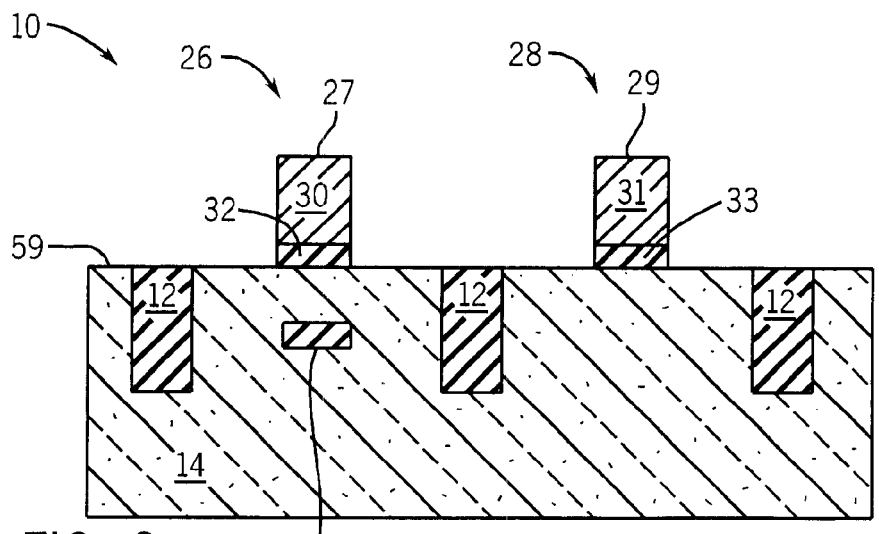
FIG. 6 is a cross-sectional view of the portion illustrated in FIG. 5, showing gate stack formation step.

Referring now to FIG. 6, gate stack 27 of device 16 and gate stack 29 of device 28 are formed by conventional photolithography and etching techniques. Gate stack 27 includes portion 30 and insulative layer 32. Similarly, gate stack 29 includes portion 31 and insulative layer 33. Portion 30 of gate stack 27 and portion 31 of gate stack 29 may be heavily doped with a dopant such as boron.

Figure 7:
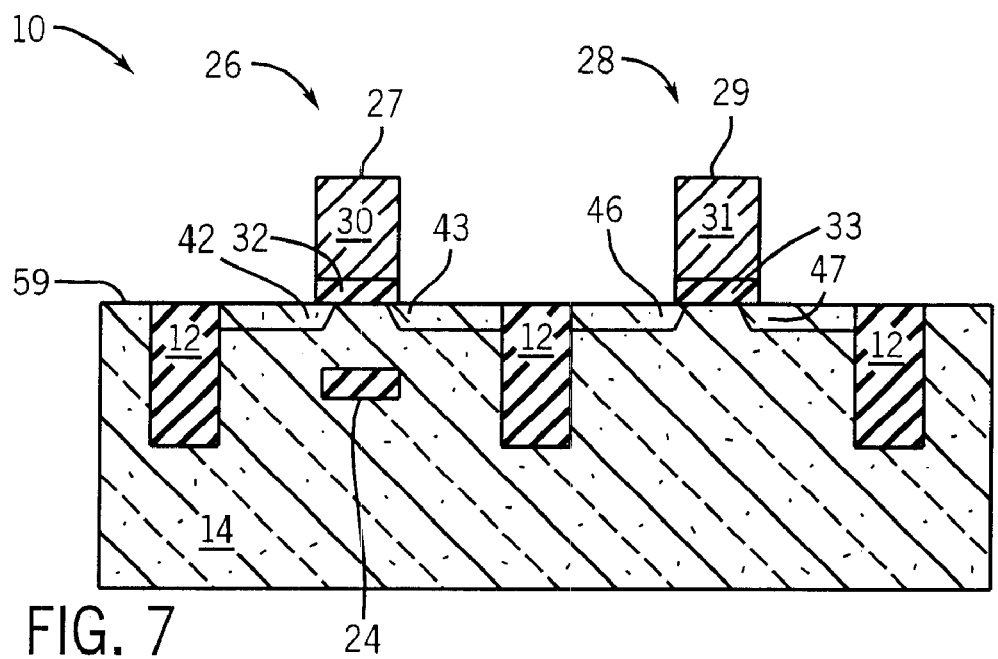
FIG. 7 is a cross-sectional view of the portion illustrated in FIG. 6, showing a source/drain area formation step.

Referring to FIG. 7, after formation of gate stack 27 and gate stack 29, substrate 14 is doped to form source/drain extension areas 42, 43, 46 and 47. Extension areas are formed in part by subjecting substrate 14 to a dopant implant under separate photolithographic masks for the P-channel and N-channel transistors. The dopant implant can be arsenic (As), boron difluoride ($BF_2$), indium (In), phosphorous (P), or any appropriate dopant for semiconductor fabrication operations.

Figure 8:
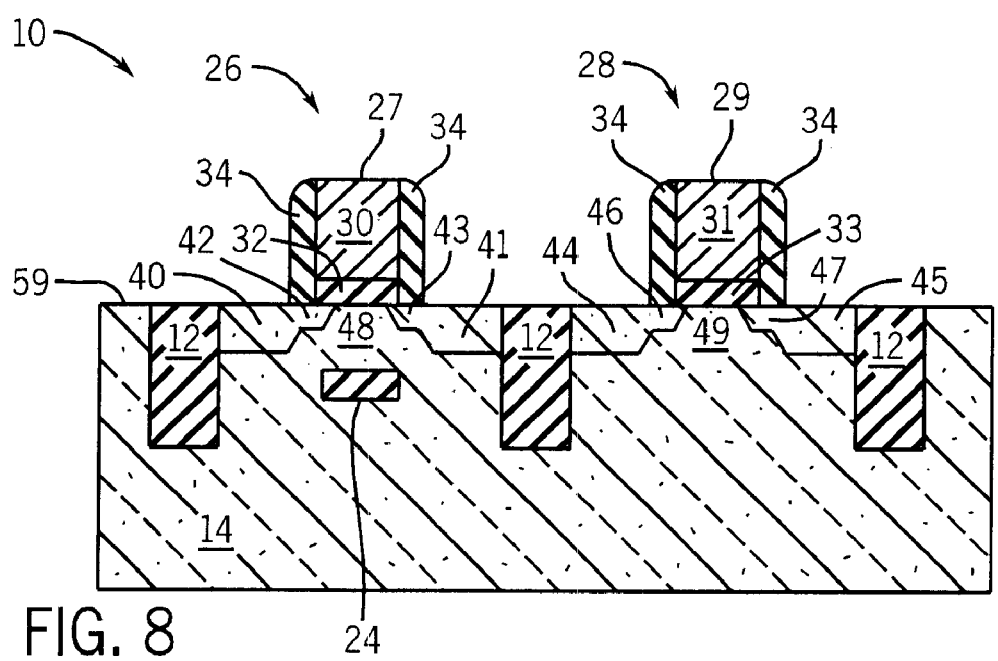
FIG. 8 is a cross-sectional view of the portion illustrated in FIG. 7 showing a sidewall spacers formation step.

Referring to FIG. 8, sidewall spacers 34 can be formed to abut gate stack 27 and gate stack 29. After formation of sidewall spacers 34, substrate 14 is subjected to a dopant implant to form source/drain areas 40, 41, 44 and 45. The dopant implant can be substantially similar to the dopant implant used to form source/drain extensions 42, 43, 46 and 47 except that the dopant implants cause dopants to form at a greater depth below top surface 59 of substrate 14. Following completion of the described steps, portion 10 is as described in relation to FIG. 1. Thus, a local selective inert ion implantation is done to create dual threshold voltage MOSFET devices on the same IC.

An alternative embodiment of the present invention involves performing the material implantation step (described in relation to FIG. 3 of the exemplary embodiment) after formation of gate stack 27. Thus, the implant material is implanted through gate stack 27 and into substrate 14. The processing steps of the alternative embodiment are substantially the same as in the exemplary embodiment and as such will be described in relation to FIG. 1. In the alternative embodiment, conventional IC fabrication is performed including formation of shallow trench isolation structures 12 and gate stacks 27 and 29. Preferably, conventional fabrication involves CMOS processing. After formation of gate stacks 27 and 29, a photoresist material is formed over portion 10. Using conventional photolithography methods, an aperture is opened above gate stack 27.

With the aperture opened above gate stack 27, an implant material is implanted into substrate 14, through the aperture and gate stack 27. The implant material and method is the same as described in the exemplary embodiment with relation to FIG. 3. To facilitate implantation through the gate and into the substrate, the implantation step in the alternative embodiment is performed at a different energy and/or dose than in the exemplary embodiment. Preferred energy and doses can be $5 \times 10^{14} - 1 \times 10^{15}$ per square centimeter and 10–20 KeV, respectively. After completion of the implantation step, portion 10 appears as illustrated in FIG. 6. Fabrication of portion 10 continues as described in the exemplary embodiment with respect to FIG. 7 and FIG. 8. Ultimately, portion 10 appears as described in FIG. 1.

It is understood that, while detailed drawings and specific examples given describe preferred exemplary embodiments of the present invention, they are for the purpose of illustration only. The present invention is not limited to the precise details, methods, materials, and conditions disclosed. For example, the specific dopant concentrations of region 24 may vary by an order of magnitude or more from those disclosed herein, depending upon the particular application of the present invention. Additionally, the present invention is not limited to applications in MOSFETs or even transistors, but may find applications in other semiconductor device structures. The various layers, contacts, cells, and transistors may have different geometry depending on integrated circuit designs and process technologies. Accordingly, the present invention is not to be limited to any specific embodiment herein, but rather is to extend to all embodiments now known or later developed that fall within the spirit and scope of the present invention as defined by the claims appended hereinafter.

What is claimed is:

1. A method of fabricating an integrated circuit including a plurality of transistors, the plurality of transistors including a first transistor having a first threshold voltage and a second transistor having a second threshold voltage, the first transistor and the second transistor both being N-type or both being P-type FETs, the first threshold voltage being different than the second threshold voltage, the first transistor having a first channel region between a first source and a first drain, the second transistor having a second channel region between a second source and a second drain, the first channel region being located at a first location and the second channel region being located at a second location, the method comprising steps of:

providing a substrate;
providing a mask above the substrate;
patterning the mask to have an aperture above the first location the mask covering the second location; and
providing an inert material through the aperture and into substrate, wherein the inert material includes nitrogen ions and accumulates below the first channel region to form a semi-insulating layer substantially exclusive of being below the first drain and the first source, whereby the semi-insulating layer confines a depletion layer of the first transistor during operation of the first transistor, thereby causing the first threshold voltage to be different than the second threshold voltage.

2. The method of claim 1, wherein the inert material includes a plurality inert ions.

3. The method of claim 2, wherein the inert ions include at least one of nitrogen, oxygen, xenon, or argon ions.

4. The method of claim 3, wherein the semi-insulating layer is 20–50 nanometers below a top surface of the substrate.

5. The method of claim 1, further comprising:
thermally annealing the substrate to electrically activate dopants associated with the first source and the first drain, wherein the inert material is not electrically activated by the thermally annealing step.

6. The method of claim 1, further comprising: forming a first gate above the first channel region and a second gate above the second channel region.

7. The method of claim 1, wherein the inert material is implanted with a dosage of approximately $1 \times 10^{16}$ dopants per centimeter squared.

8. The method of claim 1, wherein the mask is provided above a gate dielectric layer and a gate conductor layer, the aperture exposing the gate conductor layer at the first location.

9. A method of fabricating an integrated including a plurality of transistors, the plurality of transistors including a first transistor having a first threshold voltage and a second transistor having a second threshold voltage, the first transistor and the second transistor both being N-type or both being P-type FETs, the first threshold voltage being different than a the second threshold voltage, the first transistor having a first channel region between a first source and a first drain, the second transistor having a second channel region between a second source and a second drain, the first channel region being located at a first location and the second channel region being located at a second location, the method comprising:

providing a gate dielectric layer and a gate conductor layer above a substrate;
providing a mask above the gate conductor layer;
forming an aperture in the mask at the first location, wherein the mask covers the second location; and
implanting an inert ion through the aperture to form a semi-insulating layer being below the first channel, the inert ion including nitrogen, the semi-insulating layer being disposed below the first channel region and substantially exclusive of being below the first drain region and the first source region causing the first threshold voltage to be different than the second threshold voltage.

10. The method of claim 9, wherein the inert ion is not electrically activated.

11. The method of claim 10, wherein the inert ion includes at least one of nitrogen, oxygen, xenon, or argon ions.

12. The method of claim 11, wherein the implanting step is performed at a dose of $5 \times 10^{14}$ to $1 \times 10^{15}$ dopants per square centimeter at an energy of 10–20 KeV.

13. A method of fabricating an integrated circuit including a plurality of transistors, the plurality of transistors including a first transistor having a first threshold voltage and a second transistor having a second threshold voltage, the first transistor and the second transistor both being N-type or both being P-type FETs, the first threshold voltage being different than the second threshold voltage, the first transistor having a first channel region between a first source and a first drain, the second transistor having a second channel region between a second source and a second drain, the first channel region being located at a first location and the second channel region being located at a second location, the method comprising steps of:

providing a substrate;

providing a mask above the substrate;

patterning the mask to have an aperture above the first location, the mask covering the second location, the aperture exposing a top surface of the substrate; and implanting inert ions through the aperture and into substrate, wherein the inert ions include nitrogen and accumulate below the first channel region and substantially exclusive of below the first drain and the first source to form a semi-insulating layer, whereby the semi-insulating layer confines a depletion layer of the first transistor during operation of the first transistor, thereby causing the first threshold voltage to be different than the second threshold voltage.

14. The method of claim 13, wherein the inert ions include argon, xenon, or nitrogen.

15. The method of claim 14 wherein the inert ions include at least one of nitrogen, oxygen, xenon, or argon ions.

16. The method of claim 13, further comprising: a gate above the first channel region.

17. The method of claim 16 wherein the inert ions are implanted below a depth of 20 nm.

18. The method of claim 17 wherein the accumulation of inert ions includes at least one of: nitrogen, xenon, or argon ions.

19. The method of claim 18 wherein the accumulation of inert ions is at least 200 Angstroms from the gate.

20. The method of claim 17 wherein the first threshold voltage is less than the second threshold voltage.

* * * * *